United States Patent [19]

Oren et al.

[11] Patent Number: 4,725,565
[45] Date of Patent: Feb. 16, 1988

[54] METHOD OF DIFFUSING CONDUCTIVITY TYPE IMPARTING MATERIAL INTO III-V COMPOUND SEMICONDUCTOR MATERIAL

[75] Inventors: Moshe Oren, Burlington, Mass.; Francisco C. Prince, Campinas, Brazil

[73] Assignee: GTE Laboratories Incorporated, Waltham, Mass.

[21] Appl. No.: 878,728

[22] Filed: Jun. 26, 1986

[51] Int. Cl.⁴ ........................................ H01L 21/223
[52] U.S. Cl. .................................................. 437/168
[58] Field of Search .................... 148/186, 189, 187; 420/555

[56] References Cited

U.S. PATENT DOCUMENTS

| | | | |
|---|---|---|---|
| 3,139,362 | 6/1964 | D'Asaro et al. | 148/189 X |
| 3,215,571 | 11/1965 | Frieser | 148/189 |
| 3,485,685 | 12/1969 | Casey, Jr. et al. | 148/189 |
| 3,713,910 | 1/1973 | Matino | 148/188 X |
| 3,755,016 | 8/1973 | Russ et al. | 148/186 X |
| 3,984,267 | 10/1976 | Craford et al. | 148/189 X |

*Primary Examiner*—George T. Ozaki
*Attorney, Agent, or Firm*—David M. Keay

[57] ABSTRACT

Method of diffusing sulfur into gallium arsenide without degrading the surface of the gallium arsenide. A gallium arsenide wafer is placed in close proximity to a quantity of powdered gallium sulfide intermixed with powdered gallium arsenide. The assemblage is heated in an open-tube furnace in the presence of flowing nitrogen to vaporize sulfur while the gallium arsenide and gallium sulfide are in thermodynamic equilibrium whereby sulfur diffuses into the gallium arsenide wafer without eroding the surface.

11 Claims, 2 Drawing Figures

METHOD OF DIFFUSING CONDUCTIVITY TYPE IMPARTING MATERIAL INTO III-V COMPOUND SEMICONDUCTOR MATERIAL

BACKGROUND OF THE INVENTION

This invention relates to semiconductor materials. More particularly, it is concerned with methods of introducing conductivity type imparting material into III-V compound semiconductor materials.

It has been difficult to diffuse donor materials, which impart N-type conductivity, into III-V compound semiconductor materials, specifically gallium arsenide. At the high temperatures required to diffuse donor material into gallium arsenide there is a preferential arsenic evaporation from the gallium arsenide resulting in heavily eroded surfaces. Therefore, it has been the practice to introduce donor materials, particularly silicon, into III-V compound semiconductor materials by ion implantation techniques to produce N-type material.

Ion implantation techniques cause crystalline damage which must be annealed out by a high temperature treatment, carefully controlled so as not to cause degradation of the surface. The peak concentration of ion implanted materials is located below the surface. This carrier concentration profile results in metal-semiconductor field effect transistors (MESFETs) having low transconductance. For high transconductance devices very shallow, highly-doped N-type surface layers are desired in which the carrier concentration is at a maximum at the surface dropping very rapidly into the bulk of the material.

One procedure for obtaining a satisfactory N-type diffusion profile in gallium arsenide employs a sealed ampule technique. A gallium arsenide wafer is vacuum sealed in a quartz ampule together with the donor source and arsenic, and heated in a furnace at a temperature of between 800° C. to 900° C. After diffusion the ampule is withdrawn from the furnace and the source side of the ampule quenched to prevent deposition of vapor on the wafer surface during cooling. This method, however, is very limited and is not suitable for large-scale production of gallium arsenide integrated circuits.

SUMMARY OF THE INVENTION

Shallow highly doped N-type diffused layers are obtained in bodies of III-V compound semiconductor material by the method in accordance with the present invention. The method comprises placing a body of III-V compound semiconductor material in close proximity to a quantity of a donor compound having as one constituent element a group III element which is a constituent element of the III-V compound semiconductor material and having as a second constituent element an element which is a donor element for the III-V compound semiconductor material. The assemblage is heated to vaporize the second constituent element with the III-V compound semiconductor material and the donor compound in thermodynamic equilibrium whereby the second constituent element diffuses into the III-V compound semiconductor material with erosion of III-V compound semiconductor material.

In a more specific aspect of the invention a body of gallium arsenide is placed in close proximity to a quantity of gallium sulfide. The assemblage is heated to vaporize sulfur with the gallium arsenide and the gallium sulfide in thermodynamic equilibrium whereby sulfur diffuses into the gallium arsenide without erosion of gallium arsenide.

For a better understanding of the present invention, together with other and further objects, advantages, and capabilities thereof, reference is made to the following disclosure and appended claims in connection with the above-described drawings.

DETAILED DESCRIPTION

The present invention is concerned with introducing N-type conductivity imparting materials, donor materials, into III-V compound semiconductor materials by diffusion. The III-V compound semiconductor materials include materials such as GaAs, InP, InAs, InGaAs, GaAlAs, and InGaAsP. These materials may be combined to form various types of III-V heterojunction materials. Donor materials which may be introduced into III-V compound semiconductor materials to produce N-type conductivity include silicon, tellurium, selenium, and sulfur.

A wafer of a III-V compound semiconductor material is prepared in the usual well-known manner. The source of the donor material to be diffused into the wafer is a powder of a compound having as one constituent element the same group III element as the wafer, and having as a second constituent element the donor element. The wafer is placed in close proximity to, but spaced from, a quantity of the powdered donor compound and the assemblage is heated to vaporize the donor element with the III-V compound semiconductor material and the donor compound in thermodynamic equilibrium. The donor constituent element diffuses into the III-V compound semiconductor material, and because of the thermodynamic equilibirum condition there is no erosion of the wafer due to arsenic evaporation from the wafer surface.

Figure 1:
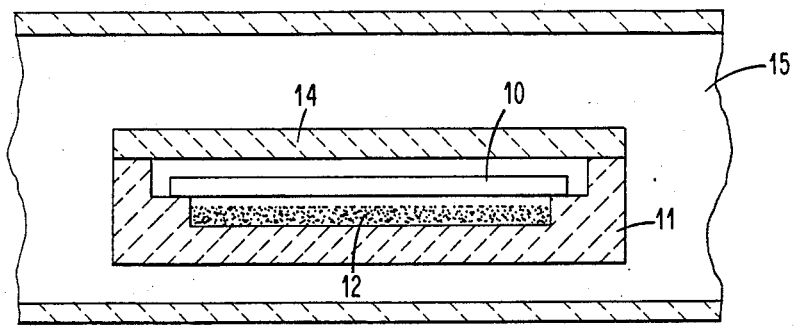
FIG. 1 is a representation in cross-section illustrating the assemblage of parts during the diffusion method in accordance with the present invention.

FIG. 1 depicts the arrangement of various parts and materials for the heat treatment. The wafer of III-V compound semiconductor material 10 is placed on a shelf in a graphite boat 11. A quantity of a source of donor material 12 is placed in a recess in the lower portion of the graphite boat 11 so as to be in close proximity to, but spaced from, the wafer 10. A graphite cover 14 is placed over the graphite boat and the assemblage is placed in a conventional open-tube quartz furnace 15. The assemblage within the furnace 15 is heated while an inert gas is flowed through the furnace 15. During heating the donor element varporizes from the donor source material 12 while thermodynamic equilibirum conditions are established between the III-V compound semiconductor material of the wafer 10 and the donor compound 12.

A wafer of single crystal semi-insulating GaAs 10 was placed in close proximity to, but not in contact, with a quantity of a donor source 12 in a graphite boat 11. The separation between the donor source material 12 and the wafer 10 was approximately 1 millimeter.

The donor source material 12 was a mixture of $Ga_2S_3$ (gallium sulfide) and GaAs powders mixed together. The graphite boat 11 was placed in an open-tube furnace 15 under continuous flow of high-purity nitrogen. The assemblage was heated at a temperature between 750° C. and 900° C. for periods of from about 15 to 30 minutes. The actual temperature and time of heating was varied depending upon the particular diffusion profile of sulfur desired.

Donor material may be diffused into a gallium arsenide wafer at an entire surface of the wafer. Alternatively, donor material may be selectively diffused at portions of the surface of the wafer by protecting portions of the surface not to be diffused with a thin layer of a suitable masking material during the diffusion. More specifically, a coating of silicon nitride is deposited on the surface of the wafer and portions selectively removed by employing known techniques in order to expose surface areas of the wafer into which the donor material is to be diffused. The wafer is placed in the boat with the coated surface facing the source of donor material. Those regions of the surface covered by the dielectric coating are protected from the donor material during the diffusion treatment.

Figure 2:
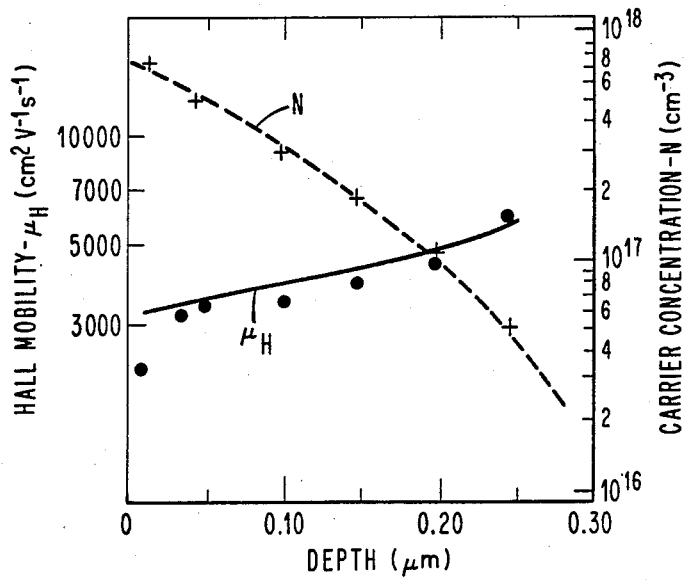
FIG. 2 illustrated graphs of carrier concentration and mobility profile of gallium arsenide wafers diffused with sulfur in accordance with the method of the present invention.

FIG. 2 illustrates the carrier concentration and the mobility profile for gallium arsenide wafers which were treated at a temperature of 850° C. for 30 minutes with the donor source being a mixture of $Ga_2S_3$ and GaAs. The carrier concentration N at the surface is approximately $7.5 \times 10^{17}$ cm$^3$ and drops rapidly to $10^{17}$ at a depth of less than 0.2 micrometers. The curve of Hall mobility $\mu_H$ is the measured mobility as a function of electron concentration. These curves indicate that the diffused N-type layer is of a very high quality with extremely low compensation.

The method as described provides for the open tube diffusion of sulfur into gallium arsenide without degradation of the surface by erosion of arsenic. The N-type layers obtained by the method are of very high quality and extremely low compensation. Compared to silicon implanted gallium arsenide which is widely used for gallium arsenide integrated circuit fabrication, sulfur diffused gallium arsenide does not require annealing and there is no residual damage that can deteriorate carrier mobility. In addition, the peak carrier concentration of the diffused layers at at the surface dropping very rapidly toward the bulk. Thus, the material is extremely suitable for the fabrication of high conductance devices such as MESFETs.

While there has been shown and described what is considered a preferred embodiment of the present invention, it will be obvious to those skilled in the art that various changes and modifications may be made therein without departing from the invention as defined by the appended claims.

What is claimed is:

1. The method of introducing a donor element into a body of gallium arsenide comprising
    placing a body of gallium arsenide in close proximity to a donor source consisting essentially of a quantity of a donor compound in powder form intermixed with gallium arsenide in powder form, said donor compound having gallium as one constituent element and having as a second constituent element an element which is a donor element for gallium arsenide;
    placing the body of gallium arsenide and donor source in an open-tube furnace; and
    heating while flowing an inert gas through the open-tube furnace to vaporize said donor element with the gallium arsenide and the donor compound in thermodynamic equilibrium whereby said donor element diffuses into the body of gallium arsenide.
2. The method in accordance with claim 1 wherein said donor element is selected from the group consisting of sulfur, tellurium, and selenium.
3. The method in accordance with claim 1 wherein said donor compound is gallium sulfide.
4. The method in accordance with claim 3 wherein heating comprises heating at a temperature of between about 750° C. and 900° C.
5. The method of introducing a donor element into a wafer of gallium arsenide comprising
    placing a wafer of gallium arsenide and a quantity of a donor source in a boat with a planar surface of the wafer of gallium arsenide facing and in close proximity to the donor source; said quantity of a donor source consisting essentially of a quantity of a donor compound in powder form intermixed with gallium arsenide in powder form; said donor compound having gallium as one constituent element and having as a second constituent element an element which is a donor element for gallium arsenide;
    placing the boat containing the wafer of gallium arsenide and the quantity of the donor source in an open-tube furnace; and
    heating while flowing an inert gas through the open-tube furnace to vaporize said donor element with the gallium arsenide and the donor compound in thermodynamic equilibrium whereby said donor element diffuses into the wafer of gallium arsenide.
6. The method in accordance with claim 5 wherein said donor element is selected from the group consisting of sulfur, tellurium, and selenium.
7. The method in accordance with claim 5 wherein said donor compound is gallium sulfide.
8. The method in accordance with claim 7 wherein heating comprises heating at a temperature of between about 750° C. and 900° C.
9. The method in accordance with claim 8 wherein heating comprises heating for a period of from about 15 to 30 minutes.
10. The method in accordance with claim 9 wherein said surface of the wafer of gallium arsenide is separated from the quantity of gallium sulfide intermixed with gallium arsenide by approximately one millimeter while heating in the open-tube furnace.
11. The method in accordance with claim 10 including
    forming a coating of a masking material in a predetermined pattern on said surface of said wafer of gallium arsenide prior to placing the wafer in close proximity to said quantity of gallium sulfide intermixed with gallium arsenide, and
    placing the wafer with said coating facing said quantity of gallium sulfide intermixed with gallium arsenide
    whereby sulfur diffuses into said wafer at the portion of the surface not coated with masking material.

* * * * *